May 20, 1952 R. F. FOSTER 2,597,629

ELECTRON DISCHARGE AMPLIFIER

Filed Nov. 19, 1948

Inventor:
Raymond F. Foster,
by Merton D. Morse
His Attorney.

Patented May 20, 1952 2,597,629

UNITED STATES PATENT OFFICE 2,597,629

ELECTRON DISCHARGE AMPLIFIER

Raymond F. Foster, Stratford, Conn., assignor to General Electric Company, a corporation of New York Application November 19, 1948, Serial No. 61,058

4 Claims. (Cl. 179—171)

Figure 1:
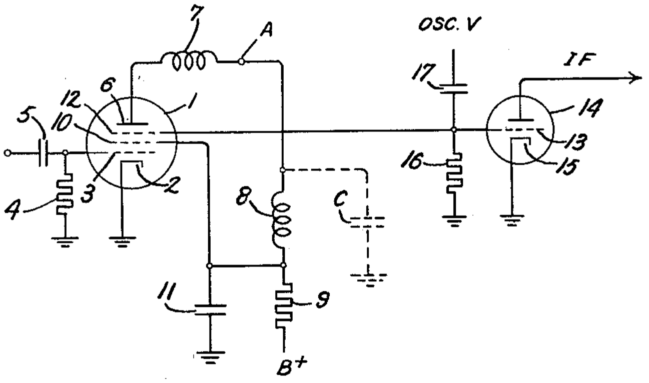

My invention relates to electron discharge amplifiers and, more particularly, to high frequency amplifiers which are operating at frequencies suitable for television reception. It is a primary object of my invention to provide an electron discharge amplifier which will be particularly efficient when operating on the higher frequency television bands.

In amplifiers operating at very high frequencies, such as those employed in television receivers which are required to receive and amplify signals in a frequency range of from 50 to 200 megacycles, the total shunting capacity associated with the anode circuits of the electron discharge devices of the amplifier may be so large as to make tuning of the anode circuit to the desired frequency practically impossible. The anode circuit capacity may be so large that even with a coil of minimum inductance, such as a straight piece of copper ribbon, the resonant frequency of the tuning inductance and shunting capacity will not be high enough for the higher frequency television bands. This disadvantage is particularly apparent in single tuned amplifiers wherein the total anode capacity comprises the output capacity of the first amplifier, the input capacity of the second amplifier, the tube socket capacity of both amplifiers and stray wiring capacity; although from the standpoint of circuit simplicity and elimination of complicated band switching arrangements the use of such a single tuned amplifier circuit is very desirable.

Also in amplifiers operating at very high frequencies difficulties may be encountered due to the inductance of the lead conductor which connects the anode of the amplifier to the anode tuning inductance. Inasmuch as the anode lead inductance and the anode tuning inductance may be of the same order of magnitude at high frequencies, a large portion of the amplified signal voltage may appear across the anode lead inductance. A substantial portion of the anode lead inductance is comprised of the lead connecting the anode inside the envelope of the electron discharge device to the tube socket so that when an output connection is taken from the tube socket, as is done in conventional amplifiers, the signal voltage drop across the anode lead inductance is lost. This loss of signal voltage may become great enough at high frequencies so that the overall amplification of the amplifier stage becomes less than unity.

It is therefore an object of my invention to provide a new and improved high frequency amplifier in which the anode circuit capacity is substantially reduced.

It is a further object of my invention to provide a new and improved high frequency amplifier in which the signal voltage which actually exists at the anode of the amplifier may be coupled to the next succeeding stage without substantial loss thereof.

It is a still further object of my invention to provide a new and improved electron discharge amplifier in which a simplified output coupling circuit may be employed.

In its broad aspect, my invention consists in connecting the suppressor electrode of a pentode type electron discharge device, such as is used in radio frequency amplifiers for television receivers, directly to the control electrode of the next succeeding electron discharge device, such as the converter oscillator stage of a television receiver. This effectively removes the input capacity of the next succeeding stage on the socket and stray circuit capacities associated therewith from the anode circuit of the radio frequency amplifier and allows the anode circuit of the radio frequency amplifier to be tuned to a much higher frequency before it is limited by the shunting capacity associated therewith. Inasmuch as the suppressor electrode of the radio frequency amplifier is normally operated at ground potential for direct current, a direct connection between the suppressor electrode of the radio frequency amplifier and the control electrode of the converter-oscillator eliminates the conventional coupling capacitor which is used to block the uni-directional potential existing at the anode from the control electrode of the converter. The use of such a suppressor electrode output circuit has the additional advantage that the voltage which actually exists at the anode of the radio frequency amplifier is obtained without substantial diminution due to the voltage drop across the lead inductances.

Figure 2:
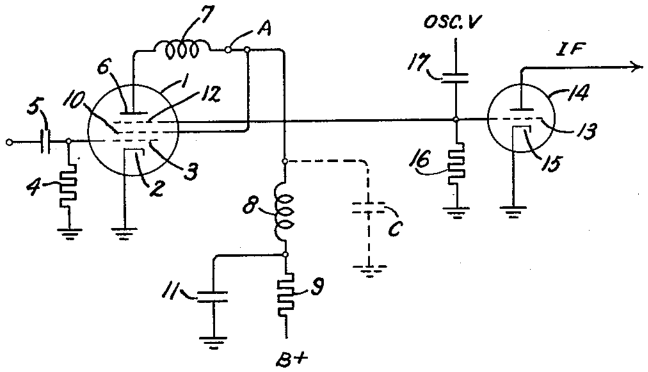

The novel features which are considered to be characteristic of my invention are set forth with particularity in the appended claims. My invention itself, however, both as to its organization and method of operation, together with further objects and advantages thereof, may best be understood by reference to the following description taken in connection with the accompanying drawings wherein Fig. 1 is a circuit diagram of an amplifier embodying my invention; Fig. 2 is a circuit diagram of an amplifier embodying an alternative form of my invention.

Referring to Fig. 1 of the drawing, I have shown the principles of my invention as embodied in a high frequency amplifier employing a pentode electron discharge device 1 which operates as a radio frequency amplifier. The cathode 2 of device 1 is connected to ground. The control electrode 3 of device 1 is connected to ground through a leak resistor 4. Input signals are applied through coupling capacitor 5 to the control electrode 3. The anode 6 of device 1 is connected through an anode lead inductance 7, anode tuning inductance 8 and a decoupling resistor 9 to a uni-directional source of voltage indicated by the legend B+, the tube socket anode connection point being indicated at point A in the drawing. It will be understood that a large portion of anode lead inductance 7 may be the lead extending within the envelope of device 1. The screen electrode 10 of device 1 is connected to the junction point of inductance 8 and resistor 9 and a filter capacitor 11 is connected from this junction point to ground. The suppressor electrode 12 of device 1 is directly connected to the control electrode 13 of an electron discharge device 14 which operates as a signal converter stage. The cathode 15 of electron discharge 14 is connected to ground and the control electrode 13 is also connected to ground through leak resistor 16.

The radio frequency output voltage from device 1 is heterodyned in device 14 with a locally generated oscillator voltage, which is shown as connected to the control electrode 13 of converter device 14 through capacitor 17, and a signal voltage of intermediate frequency is selected in the anode circuit of device 14 for further amplification as will be readily understandable to those skilled in the art. The anode circuit capacity of device 1 which comprises the output capacity of device 1 and the tube socket and stray wiring capacity associated therewith is indicated as a lumped capacity C which is connected across the anode tuning inductance 8.

Considering the operation of the amplifier shown in Fig. 1, input signals are coupled to the control electrode of device 1 through the conventional coupling circuit 4, 5. These signals appear in amplified form at the anode 6 of device 1 and due to the inter-electrode capacity between anode 6 and suppressor electrode 12 and also due to the effect of the electron stream coupling between the anode and the suppressor electrode, the voltage which exists at anode 17 is coupled to the suppressor electrode. The capacitive and electron stream coupling thus causes the potential of the suppressor electrode to follow the anode signal voltage and an output signal voltage appears across resistor 16. Resistor 16 acts as an output impedance for the suppressor electrode of device 1 and also as a leak resistor for both the suppressor electrode 12 and the control electrode 13 so that these electrodes do not acquire a D. C. charge.

It is an important feature of my invention that substantially the entire signal voltage which actually exists at the anode of device 1 is coupled to the next succeeding stage. If an output connection is taken from the anode tube socket terminal, shown as point A in the drawing, there is a division of signal voltage between anode lead inductance 7 and the external anode tuning inductance 8. The external tuning inductance is necessarily vary small. Consequently, the voltage drop across anode lead inductance 7, which may be a substantial portion of the total anode circuit signal voltage, is then lost by an output connection to point A. However, by employing my suppressor electrode coupling circuit, substantially all the signal voltage which is present at the anode of device 1 is coupled to the next succeeding amplifier stage and the overall gain of the amplifier is substantially increased. At high frequencies the gain of an amplifier incorporating my suppressor electrode coupling circuit is greater than that of a transformer coupled amplifier even though the double tuned coupling transformer of the latter provides an additional step up of voltage.

In conventional amplifiers wherein the signal voltage across tuning inductance 8 is coupled from point A to the control electrode of device 13 through the conventional blocking capacitor, the total anode circuit capacity C is comprised of the output capacity of device 1, the tube socket capacity associated with device 1, the input capacity of device 14, the tube socket capacity associated with device 14, the stray wiring capacity of the circuit and the distributed capacity of inductance 8. This total anode circuit capacity is large enough so that the resonant frequency of inductance 8 and the anode capacity is somewhat below the higher frequency television bands even though inductance 8 is made to have the minimum value possible. However, with my direct connection of suppressor electrode 12 to the control electrode 13 the anode circuit capacity of device 1 is considerably reduced. This is readily apparent when it is realized that the input and tube socket capacity of device 14 is placed in series with the anode-to-suppressor electrode capacity of device 1. The capacity of the series combination which is presented to the anode circuit is less than the anode-to-suppressor electrode capacity which is itself considerably smaller than the input and tube socket capacity of device 14. This reduction in anode circuit capacity allows inductance 8 to be of a reasonable size and still tune to the desired high frequency. Thus, in the conventional amplifier employing anode to control electrode coupling, the inductance 8 consists of a straight piece of copper ribbon which is as short as possible, whereas the inductance 8 of my improved amplifier is a large coil of a substantial number of turns which may be easily adjusted in production quantities.

With the direct connection between the suppressor electrode of device 1 and the control electrode of device 14 the coupling capacitor which has heretofore been required in conventional amplifiers to block the unidirectional potential existing at the anode of the radio frequency amplifier is eliminated. While the use of such a direct connection is particularly suited to radio frequency amplifiers because of the reduction of anode circuit capacity and increased amplifier gain, it will be understood that such a direct connected output circuit may be used in lower frequency amplifiers, such as the intermediate frequency amplifiers of superheterodyne receivers, to eliminate the conventional blocking capacitor now in use therein.

The modified form of my invention represented in Fig. 2 of the drawing differs from that of Fig. 1 only in certain particulars. Corresponding elements have been designated by the same reference numerals and the function of these elements is essentially the same, therefore they need not be repeated here. In this modification the pentode device 1 is shown with the screen electrode 10 directly connected to the anode 6 at the tube socket of device 1. With this connection device 1 operates in a manner similar to a triode type of electron discharge device. A triode type of operation is particularly advantageous when employed in an amplifier incorporating the principles of my invention because the connection of the screen electrode to the anode enhances the follower action of the suppressor electrode 12. This is readily apparent when it is considered that the suppressor electrode is physically intermediate the anode and screen electrode and with the potential of both the screen and anode changing due to signal voltage across the anode load inductances 7 and 8, the tendency of the suppressor electrode to follow the changing potential of the anode circuit is greatly increased. The increased follower action of the suppressor electrode is due partly to the increased electron coupling which is obtained by the connection of the screen electrode to the anode and partly to the increased coupling capacity to the suppressor electrode. That the interelectrode coupling capacity has been increased will be readily apparent when it is seen that the capacity between the suppressor electrode and the screen electrode is now in parallel with the capacity between the anode and the suppressor electrode.

The use of such a triode connection has the additional advantage when device 1 is used as a radio frequency amplifier in that device 1 has a higher signal-to-noise ratio than with the pentode type of operation shown in Fig. 1 as will be readily apparent to those skilled in the art. With the increased follower action of the triode connected circuit of Fig. 2 the directly connected suppressor output circuit may also be incorporated in low frequency amplifiers without substantial loss in gain, thus eliminating the conventional interstage blocking capacitor.

While I have shown and described my invention as applied to a particular system and as embodying various devices diagrammatically shown, it will be obvious to those skilled in the art that changes and modifications may be made without distinguishing from my invention and I, therefore, aim in the appended claims to cover all such changes and modifications as fall within the true spirit and scope of my invention.

What I claim as new and desire to secure by Letters Patent in the United States is:

1. A high frequency amplifier comprising a first electron discharge device having at least an anode, a cathode, a main control electrode and an auxiliary control electrode, said auxiliary electrode being situated between said main control electrode and said anode, a second electron discharge device having a capacitive input circuit and an output circuit, a tuned anode circuit for said first device comprising an inductance connecting said anode to a unidirectional source of potential, said inductance and the circuit capacity associated therewith being resonant at the frequency to be amplified, means for applying a voltage at said resonant frequency to the control electrode of said first device, said auxiliary electrode being coupled to said anode circuit solely through the electron discharge in said first device, a circuit connection of substantially zero impedance between said auxiliary electrode and the input circuit of said second electron discharge device whereby the signal energy present at the anode of said first device may be coupled to said input circuit from said auxiliary electrode without substantial effect on the tuning of said anode circuit, said circuit connection constituting the sole means of transferring energy between said first and second electron discharge devices, and means for deriving from the output circuit of said second device said voltage in amplified form.

2. A high frequency amplifier comprising a first electron discharge device having at least an anode, an input control electrode and a suppressor electrode, a tuned anode circuit for said first device comprising an inductance connected to said anode and resonating with the capacity of said anode circuit at the frequency to be amplified, said suppressor electrode being coupled to said anode circuit solely through the electron discharge in said first device, a second electron discharge device having an input circuit having input capacity, and a conductive connection between said suppressor electrode and said input circuit, said connection constituting the sole means of transferring energy from said first to said second device, whereby the effect of said capacity of said input circuit upon the tuning of said anode circuit is substantially reduced.

3. In a high frequency amplifier, the combination of a first electron discharge device having an anode, a cathode and first, second and third grid electrodes arranged in order of spacing from said cathode, a conductive connection between said second electrode and said anode, a second electron discharge device having an input circuit, an anode circuit for said first device comprising, an anode load impedance connected to said anode, said load impedance resonating with circuit capacity at a particular operating frequency, and a conductive connection from said third electrode to said input circuit, said connection constituting the sole means of transferring energy from said first to said second discharge devices, said third electrode being coupled to said anode circuit solely through the electron discharge in said first device.

4. In a high frequency amplifier, the combination of a first electron discharge device having an anode, a cathode and first, second and third grid electrodes arranged in order of spacing from said cathode, a tuned anode circuit for said first device comprising an inductance connected to said anode, said inductance resonating with the capacity of said anode circuit at the frequency to be amplified, a direct conductive connection between said second electrode and said anode, a coupling impedance connected between said third electrode and ground, a second electron discharge device having an input electrode, and means for supplying voltage produced at said anode to said input electrode comprising a conductive connection from said third electrode to said input circuit, said third electrode being coupled to said anode circuit solely through the electron discharge in said first device and said connection constituting the sole means of transferring energy from said first device to said second device, thereby to reduce the loading effect of said input circuit upon said anode circuit.

RAYMOND F. FOSTER.

REFERENCES CITED

The following references are of record in the file of this patent:

UNITED STATES PATENTS

| Number | Name | Date |
|---|---|---|
| 1,876,793 | Thompson | Sept. 13, 1932 |
| 2,075,604 | Finch | Mar. 30, 1937 |
| 2,138,891 | Soller | Dec. 6, 1938 |
| 2,229,812 | Maitland | Jan. 28, 1941 |
| 2,245,616 | Soller | June 17, 1941 |
| 2,262,707 | Farrington | Nov. 11, 1941 |
| 2,288,236 | Green | June 30, 1942 |
| 2,400,919 | Crawley | May 28, 1946 |

FOREIGN PATENTS

| Number | Country | Date |
|---|---|---|
| 65,202 | Norway | May 19, 1939 |